United States Patent
Muntifering et al.

[11] Patent Number: 6,162,703
[45] Date of Patent: Dec. 19, 2000

[54] PACKAGING DIE PREPARATION

[75] Inventors: Tom A. Muntifering; Steven W. Heppler; Michael B. Ball, all of Boise, Id.

[73] Assignee: Micron Technology, Inc., Boise, Id.

[21] Appl. No.: 09/026,999

[22] Filed: Feb. 23, 1998

[51] Int. Cl.[7] .............................................. H01L 21/301
[52] U.S. Cl. .......................................... 438/465; 438/459
[58] Field of Search .................................... 438/110, 113, 438/114, 459, 460, 464, 465

[56] References Cited

U.S. PATENT DOCUMENTS

| | | | |
|---|---|---|---|
| 3,677,875 | 7/1972 | Althouse | 438/464 |
| 4,722,130 | 2/1988 | Kimura et al. | 451/41 |
| 4,946,716 | 8/1990 | Corrie | 438/759 |
| 5,071,792 | 12/1991 | Van Vonno et al. | 438/464 |
| 5,185,292 | 2/1993 | Van Vonno et al. | 438/464 |
| 5,223,734 | 6/1993 | Lowrey et al. | 257/401 |
| 5,234,535 | 8/1993 | Beyer et al. | 438/459 |
| 5,476,566 | 12/1995 | Cavasin | 156/249 |
| 5,480,842 | 1/1996 | Clifton et al. | 438/691 |
| 5,494,549 | 2/1996 | Oki et al. | 156/268 |
| 5,824,595 | 10/1998 | Igel et al. | 438/464 |
| 5,888,883 | 3/1999 | Sasaki et al. | 438/464 |

OTHER PUBLICATIONS

Yoshiko Hara., "Toshiba Develops Paper–Thin Package," Semiconductor News, Jun. 2, 1999, pp. 1–3.
Van Zant, et al., "The Chip Packaging Manual," Semiconductor Services, 1987 pp. 4–8, 18–21.

*Primary Examiner*—Carl Whitehead, Jr.
*Assistant Examiner*—Jeff Vockrodt
*Attorney, Agent, or Firm*—Workman, Nydegger & Seeley

[57] ABSTRACT

The present invention relates to a process for preparing a wafer for chip packaging that minimizes stress and torque on wafer components during back grinding. The wafer has fabricated thereon a plurality of dies in a die side thereof opposite a back side thereof. A protective coating is spun on the die side to protect the dies. The wafer is separated into a plurality of connected pieces by scratching or cutting a recess into streets or scribe lines in the die side. The connected pieces of the wafer are secured to a surface with the back side thereof exposed. Material is removed from the back side of the wafer by chemical, mechanical, or chemical-mechanical methods until each piece is separated or disconnected from the other pieces. The protective coating is removed. The pieces can be situated upon a flexible surface that is stretched to increase the separation between pieces. Each die in the die side of each piece is then packaged into a die package.

24 Claims, 2 Drawing Sheets

PACKAGING DIE PREPARATION

BACKGROUND OF THE INVENTION

1. The Field of the Invention

The present invention relates to fabrication of semiconductor structures. More particularly, the present invention relates to chip packaging processes and pre-packaging wafer preparation including wafer thinning and die separation.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above. The term semiconductor substrate is contemplated to include such structures as silicon-on-insulator and silicon-on-sapphire.

In the microelectronics industry, the process of miniaturization entails the shrinking of individual semiconductor devices and crowding more semiconductor devices into a given unit area. Included in the process of miniaturization is the effort to shrink the size of chip or die packages. In the fabrication sequence, chip packaging follows the fabrication of chips or dies upon a semiconductor substrate or wafer.

After a semiconductor wafer has been fabricated and the circuits thereon have been processed to completion, the die or chip packaging process begins. The purpose of the die or chip packaging process is to place individual die into a package which can then be inserted into a printed circuit board or other substrate so as to connect the die to a larger functional circuit.

Prior to chip packaging, other steps may be needed to be undertaken in order to prepare a wafer. One step is the reducing of the thickness of a wafer. It is desirable to reduce the thickness of a wafer because a greater amount of time and expense is required to saw through a thick wafer in order to separate the dies the thereon. Typically, wafer sawing produces a precise die edge. Nevertheless, sawing adds expense, processing time, and requires expensive machinery.

It may also be desirable to thin the wafer if contaminants have entered into the backside of a wafer opposite its circuit side where the electrical circuitry has been formed. For instance, dopants may have entered the backside of the wafer during a fabrication process. These dopants will form electrical junctions that may interfere with the circuitry on the front side of the wafer. Thus, in order for the electrical circuits to properly operate, the thinning of the contaminated portion of the backside of the wafer may be required.

Conventionally, thinning of the wafer is performed prior to separating the dies from the wafer. This thinning step typically reduces the wafers to a thickness between 0.762 millimeters to about 0.2 millimeters. Several processes are available to perform the thinning operation. Specifically, a mechanical or chemical-mechanical operation, such as planarization, can be used to thin the wafers. Also, the backside of the wafer can be chemically etched in order to reduce the thickness thereof.

The wafer thinning operation can cause scratching of the top side of the wafer or the inducement of stress during the abrading operation which may cause the wafer to break. In order to perform the thinning operation, the circuit side of the wafer is placed face down upon a surface. Preferably, the circuit side of the wafer will be protected from scratching or other surface defect. A material removal operation then begins to remove material from the backside of the wafer.

Where material is moved from the backside of the wafer using a chemical etchant, it is also necessary to protect the circuit side of the wafer. Such a method includes the forming of a photoresist layer on the circuit side of the wafer. Sheets composed of a polymer material having an adhesive back can also be fitted over the circuit side of the wafer to protect the same.

It is desirable to thin wafers before packaging in order to reduce the cost of packaging the dies after separation. The separation process becomes expensive as the wafer thickness goes up. Particularly, a deeper die attach cavity is required if a wafer is thicker. As such, the combination of a deeper die attach cavity and the thicker die results in a more expensive chip package. Thus, wafer thinning is an important part of reducing the cost of chip packaging.

FIG. 1 depicts a grinding table 12 having an adhesive film 14 thereon. A semiconductor substrate 10 is on adhesive film 14. Semiconductor substrate 10 includes a die side 16 and a base layer 18. Base layer 18 has a back surface 20 thereon. Die side 16 has a plurality of die formed therein which are to be singulated by a division of semiconductor substrate 10 into a plurality of pieces. Back surface 20 is subjected to a back grinding process. The purpose of the back grinding process to be performed upon back surface 20 is to thin base layer 18 prior to singulating die side 16. As seen in FIG. 1, a distance 25 indicates a distance between a center of semiconductor substrate 10 and a grinding force 26 applied to back surface 20 by a grinding wheel 24 via a grinding pad 22 thereon. With the increase in distance 25 and/or an increase in grinding force 26, the torque product of distance 25 and grinding force 26 increases. With the increase in torque, the propensity of semiconductor substrate 10 to crack or break improperly also increases. As such, it would be desirable to reduce the propensity of semiconductor substrate 10 to break during a substrate thinning process.

After wafer thinning, the wafer is divided. Conventional techniques for die separation involves sawing and scribing processes. The sawing process uses a saw and a table to cut scribe or saw lines in the circuit side of the wafer. The wafer is placed upon the table and a rotating saw blade is brought down in contact with the circuit side of the wafer. As each scribe or saw line is cut into the wafer, a stress line forms along the crystalline interior of the wafer substantially perpendicular to the backside of the wafer. After the scribe or saw lines are cut into the wafer, a stress is applied to the scribe lines to separate the wafer and individual die. This stress may be applied via a roller or other pressure technique. Alternatively, the rotating saw blade can cut all the way through the wafer to separate the wafer and individual die.

An alternative technique to sawing the wafer to singulated dies is a scribing technique which cuts a scratch along scribe lines on the circuit side of the wafer by application of a force from a diamond-tip scribe. As in sawing, the dies are separated by applying a stress to the wafer, such as a roller applied to a surface of the wafer. Upon the application of the pressure from the roller, individual dies will be separated as they break away from the consolidated wafer along the scratched scribe lines. Due to the crystalline structure of the wafer, the separation of the die will follow the scribe line approximately perpendicular to the opposing surfaces of the wafer. As such, stress will cause the wafer to break along the scratched scribe lines.

FIG. 2 depicts semiconductor substrate 10 including die side 16 and base layer 18. Semiconductor substrate 10 has saw or scribe lines marked within die side 16 and above stress lines 29. Each scribe line is cut into die side 16 by a cutting tool 28 with a cutting force 30. Cutting tool 28 can be a diamond tipped scribe or a rotating saw blade. Once the saw or scribe lines are cut within die side 16, a roller 32 having a surface 34 applies a roller force 36 to die side 16 to separate a singulated die 19 along stress line 29.

While it is desirable to thin a wafer prior to singulating the dies thereon due to the lower cost of packaging and the shorter time of throughput, thinning the wafer also causes an increased likelihood of breaking the wafer prematurely and prior to singulation. Breaking the wafer prematurely can occur during any of a chemical, mechanical, or chemical-mechanical thinning operation, wherein forces are induced within the wafer. This problem is further compounded by a desire to fabricate more dies upon a semiconductor wafer. In order to put more dies on a semiconductor wafer, the diameter of a semiconductor wafer is increased. With an increase in diameter, an increase in stress is realized as pressure is applied to the wafer during scribing or sawing operations. As the radius of the pressure from the center of the wafer increases, the torque product also increases and the propensity of the larger wafer to break goes up. A warped or cracked wafer reduces yield and causes other problems in the subsequent chip packaging process.

Given the foregoing, it would be advantageous to reduce the forces, including stress-induced forces, in the wafer during the wafer thinning process. It would also be desirable to accomplish a technique of thinning the wafer prior to packaging individual die while decreasing the propensity of the wafer to break. It would also be advantageous to develop such a technique for use with larger wafers.

SUMMARY OF THE INVENTION

The present invention relates to a pre-packaging chip processing method that avoids stressing upon a semiconductor substrate that would otherwise cause a breakage. In general, the present invention contemplates thinning of a semiconductor substrate having dies thereon after dividing the substrate into pieces or singulated dies. By dividing the substrate prior to thinning, the substrate is subjected to lower stress and torque during the thinning process.

In the inventive method, a semiconductor substrate having a die side opposite a back side is provided. The die side has a plurality of die formed therein. The back side of the semiconductor substrate is secured to a surface with die side thereof exposed. Saw or scribe line are cut along streets into the die side of the semiconductor substrate. As such the saw or scribe lines separate pieces of the semiconductor substrate. A protective layer is applied to the die side and the semiconductor substrate is then inverted onto a surface. In this position, the protective layer is secured to the surface and the back side of the semiconductor substrate is exposed. The back side of the semiconductor substrate is then subjected to a material removal process until each piece in between the saw or scribe lines is separated from the other pieces. The saw or scribes lines that are cut into the die side serve to relief or reduce the stress and other forces that act upon the substrate during the material removal process. Preferably, each piece will have one die thereon. Individual dies are then put into chip packages.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations. It is to be understood that the drawings are diagrammatic and schematic representations of the embodiment of the present invention and are not drawn to scale.

The present inventive method first performs a substrate singulation process and then performs a back side material removal process. As such, embodiments of the inventive method will be discussed below by first referring to FIG. 2 and then FIG. 1.

Figure 2:
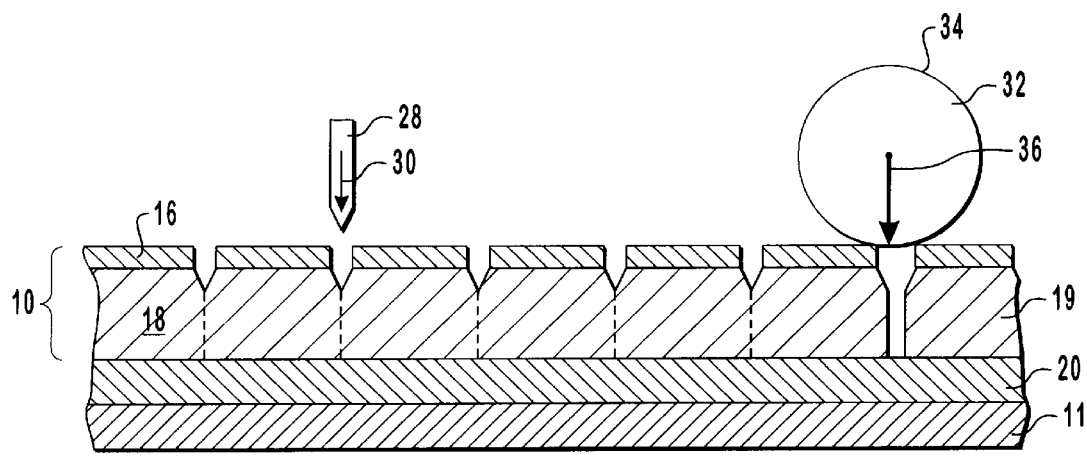
FIG. 2 is a cross-sectional elevational view of a semiconductor substrate upon a dicing table, the semiconductor substrate having been cut along scribe lines, and a pressure roller applying a downward pressure upon the circuit side of the semiconductor substrate so as to singulate each die on the semiconductor substrate.

As seen in FIG. 2, in the case of the inventive method, semiconductor substrate 10 has not been subjected to a thinning operation. The process depicted in FIG. 2 is performed upon semiconductor substrate 10 by scratching saw or scribe lines within die side 16 and above each stress line 31.

Figure 3:
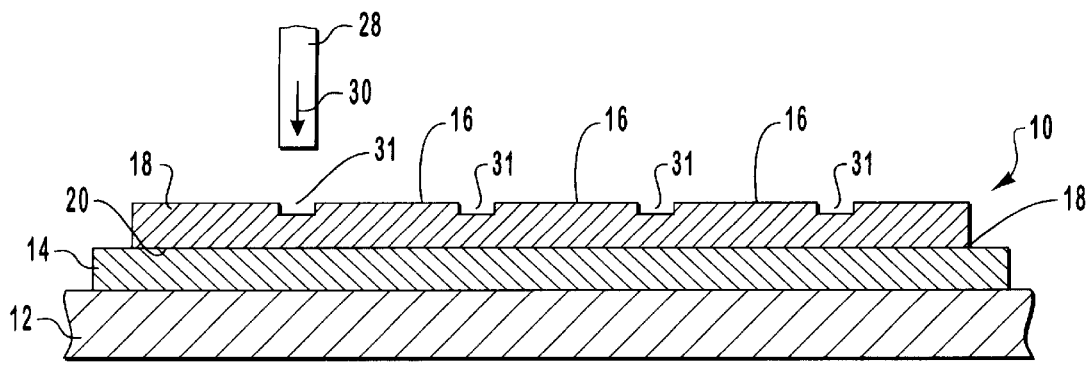
FIG. 3 is a cross-sectional elevational view of a film that is upon a surface, where saw or scribe lines have been cut into a semiconductor substrate situated upon a film.

FIG. 3 shows the result of the operation depicted in FIG. 2, where table 12 has a layer 14 thereon and semiconductor substrate 10 is situated upon layer 14. Saw or scribe lines 31 have been cut by scribe or saw 28 with force 30 into semiconductor substrate 10 at several locations in die side 16. Instead of applying force 36 to semiconductor substrate 10 with roller 32 as seen in FIG. 2, semiconductor substrate 10 is turned upside down and placed upon a layer 14 as seen in FIG. 4.

Figure 1:
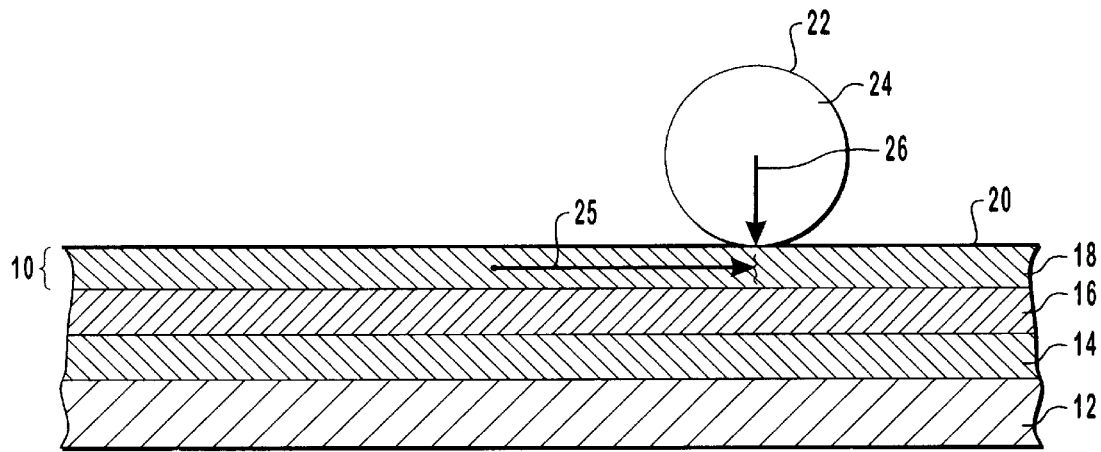
FIG. 1 is an elevational cross-section view of a back grinding operation upon a back side of a semiconductor substrate using a grinding wheel.
Figure 4:
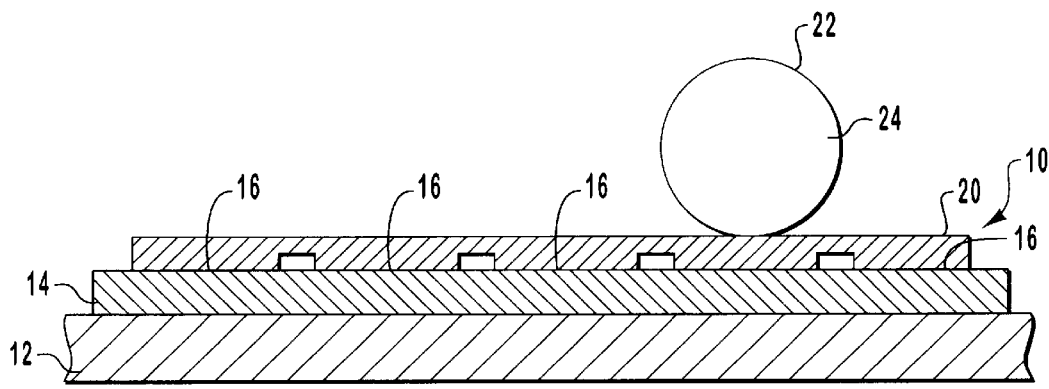
FIG. 4 depicts the semiconductor substrate seen in FIG. 3, where the semiconductor substrate has been inverted and placed upon a surface with a protective coating therebetween, and where a material removal process is performed upon the back side of the semiconductor substrate.

FIG. 4 depicts the structure seen in FIG. 3 following further processing in which surface 12 has layer 14 thereon, and semiconductor substrate 10 is in contact with layer 14. Semiconductor substrate 10 is secured to surface 12 by layer 14 so as to be relatively stable with respect to surface 12. The reorientation of semiconductor substrate 10 seen in FIGS. 3 and 4 leaves back surface 20 of semiconductor substrate 10 exposed. A grinding wheel 24 having a grinding surface 22 is depicted in FIG. 3. Grinding wheel 24 is used in a material removal process performed upon back surface 20. As with FIG. 3, FIG. 1 depicts a grinding table 12 having an adhesive film 14 thereon. Alternatively, film 14 can be a die covering so as to protect a die side 16 situated thereon. The purpose of the material removal process to be performed upon back surface 20 is to thin base layer 18 and separate semiconductor substrate 10 into separate pieces prior to packaging each singulated die on die side 16. The present invention contemplates that the thinning process can be performed upon a semiconductor substrate by mechanical, chemical, or chemical-mechanical processes, or combinations thereof.

As grinding wheel 24 abrades back surface 20, semiconductor substrate 10 is thinned. The back grinding process upon back surface 20 of semiconductor substrate 10 continues until each piece 19 is separated from other pieces 19. Preferably, each piece 19 will have a thickness in a range from about 0.2 millimeters to about 0.762 millimeters after the material removal from back surface 20 of singulated piece 19. Singulated pieces 19 seen in FIG. 5 may have a single die or multiple dies thereon after the back grinding operation. Where more than one die is on a piece 19, further and conventional singulation processing is performed upon the piece so as to separate each die from other dies prior to packaging.

Figure 5:
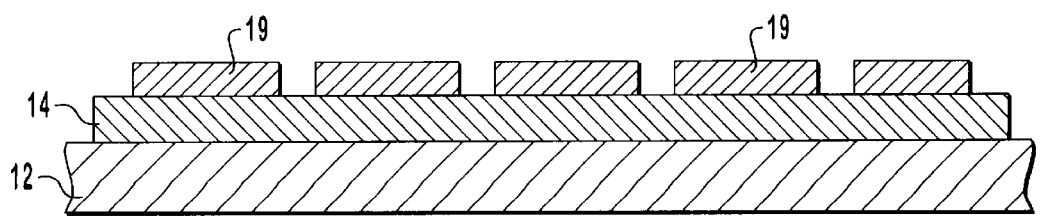
FIG. 5 depicts the semiconductor substrate seen in FIG. 4, after the material removal process upon the back surface of the semiconductor substrate has been performed sufficient to divide the semiconductor substrate into separated thinned singulated pieces.

Once singulated pieces 19 have been separated as seen in FIG. 5, layer 14, which is preferably flexible, can be stretched so as to further separate singulated pieces 19 one from another. Layer 14 can be a thin flexible plastic film or it can be a double-sided adhesive tape, or a combination of these. The purpose of layer 14 is to secure semiconductor substrate 10 stable relative to table 12 and/or provide a stretching medium so as to separate singulated pieces 19 after the material removal process upon back side 20 has continued until pieces 19 have been separated. Once singulated pieces 19 are separated one from another, the removal of singulated pieces 19 from layer 14 becomes simplified since each singulated piece 19 is separated sufficiently one from another.

Since semiconductor substrate 10 is first scribed and cut, and then subjected to a material removal process, the prior art problems encountered during thinning are overcome The cut saw or scribe lines relieve stress in semiconductor substrate 10 prior to grinding or other material removal process.

The purpose of the material removal operation is to thin each singulated piece 19 so that a minimal amount of packaging materials can be used for packaging each singulated die 19. FIG. 1 depicts the type of back grinding operation that can be performed upon semiconductor substrate 10 as seen in FIG. 4. By grinding upon the scribed semiconductor substrate 10 seen in FIG. 4, less torque and other stress forces are experienced during the back grinding process due to the saw or scribe lines which serve to relief stress.

After the dies are singulated, dies that are known to be functioning properly are selected in a vacuum picking process and placed on a section plate using a vacuum wand. If a plastic flexible film is used for securing the dies to a support surface, the film can be stretched so as to separate the dies one from another and thus aid in the vacuum picking process. From there, dies are inspected and passed on to a die attach station for subsequent chip packaging.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A semiconductor structure fabrication method comprising:

providing a semiconductor substrate having a die side opposite a back side, said die side having a plurality of die formed therein, wherein the die side is situated upon a flexible plastic sheet, the flexible plastic sheet is situated upon a double-sided adhesive tape, and the double-sided adhesive tape is upon a table;

forming a recess in the die side of the semiconductor substrate, wherein:

a first portion of said semiconductor substrate having at least one die therein is on one side of said recess; and a second portion of said semiconductor substrate having at least one die therein is on a side of said recess opposite that of said first portion of said semiconductor substrate;

removing material from said back side of said semiconductor substrate by an abrading operation sufficient to separate from contact the first portion of said semiconductor substrate from the second portion of said semiconductor substrate; and stretching said flexible plastic sheet so as to increase the separation between said first and second portions of said semiconductor substrate.

2. The method as defined in claim 1, further comprising: packaging at least one of the die into a die package.

3. The method as defined in claim 1, wherein providing said semiconductor substrate comprises:

providing a silicon wafer;

fabricating said plurality of dies in a die side of said silicon wafer.

4. The method as defined in claim 1, wherein forming said recess in the die side of the semiconductor substrate comprises:

cutting scribe lines in the die side of said semiconductor substrate.

5. The method as defined in claim 1, wherein removing material from said back side of said semiconductor substrate comprises:

grinding the back side of the first and second portions of the semiconductor substrate.

6. The method as defined in claim 1, further comprising, after forming said recess:

securing the die side of said semiconductor substrate to a surface such that the back side thereof is exposed.

7. The method as defined in claim 1, wherein said first and second portions of said semiconductor substrate each have a first thickness, and wherein removing material from said back side of said semiconductor substrate comprises:

mechanically removing material from said back side of said semiconductor substrate until said first and second portions of said semiconductor substrate each have a second predetermined thickness.

8. The method as defined in claim 1, wherein the recess in the die side of the semiconductor substrate is formed in a street or scribe line in the die side of the semiconductor substrate.

9. The method as defined in claim 1, wherein removing material from said back side of said semiconductor substrate changes the thickness of said first and second portions of said semiconductor substrate to be in a range from about 0.2 millimeters to about 0.762 millimeters.

10. A semiconductor structure fabrication method comprising:

providing a semiconductor substrate having a die side opposite a back side, said die side having a plurality of die formed therein, wherein the die side is situated upon a flexible plastic sheet, the flexible plastic sheet is situated upon a double-sided adhesive tape, and the double-sided adhesive tape is upon a table;

forming a recess in the die side of the semiconductor substrate, wherein said recess is defined by a first portion of said semiconductor substrate, a second portion of said semiconductor substrate, and third portion of the semiconductor substrate connecting the first and second portions of the semiconductor substrate;

removing material from said third portion of said semiconductor substrate at the back side thereof by an abrading operation until the first portion of said semiconductor substrate is unconnected to the second portion of said semiconductor substrate; and stretching said flexible plastic sheet so as to increase the separation between said first and second portions of said semiconductor substrate.

11. The method as defined in claim 10, wherein forming said recess comprises:

cutting a scribe line in the die side of said semiconductor substrate.

12. The method as defined in claim 11, wherein cutting said scribe line comprises using a rotating saw blade to saw into the die side of the semiconductor substrate.

13. The method as defined in claim 11, wherein cutting said scribe line in the die side of said semiconductor substrate is a process selected from a group consisting of:

moving a scribe blade under force across the die side of the semiconductor substrate so as to form said recess; and cutting into the die side of the semiconductor substrate using a rotating saw blade to form said recess.

14. A semiconductor structure fabrication method comprising:

providing a semiconductor substrate having a plurality of dies in a die side thereof opposite a back side, wherein the die side is situated upon a flexible plastic sheet, the flexible plastic sheet is situated upon a double-sided adhesive tape, and the double-sided adhesive tape is upon a table;

forming a plurality of recesses in the die side of said semiconductor substrate defining therebetween a plurality of pieces of said semiconductor substrate, each piece of said plurality of pieces having at least one die therein;

removing material from said back side of said semiconductor substrate by an abrading operation sufficient to separate said pieces; and stretching said flexible plastic sheet so as to increase the separation between said first and second portions of said semiconductor substrate.

15. The method as defined in claim 14, wherein forming said plurality of recesses comprises:

cutting a plurality of parallel and perpendicular scribe lines in the die side of said semiconductor substrate.

16. The method as defined in claim 14, wherein removing material from said back side of said semiconductor substrate is a process selected from a group consisting of:

a mechanical planarization and a chemical-mechanical planarization.

17. A chip packaging method comprising:

providing a semiconductor substrate having a die side opposite a back side, said die side having a plurality of dies formed therein and a plurality of recesses formed therein separating the dies of said plurality of dies, wherein the die side is situated upon a flexible plastic sheet, the flexible plastic sheet is situated upon a double-sided adhesive tape, and the double-sided adhesive tape is upon a table;

dividing said semiconductor substrate into a plurality of pieces by an abrading operation, wherein:
each said piece has:
a predetermined thickness;
said back side opposite said die side;
one die of said plurality of dies formed in the die side thereof; and
said dividing of said semiconductor substrate comprises removing material from the back side of the semiconductor substrate;

packaging the dies in the die side of said plurality of pieces; and stretching said flexible surface so as to increase the separation between said first and second portions of said semiconductor substrate.

18. A chip packaging method comprising:

providing a semiconductor wafer having a die side opposite a back side, said die side having a plurality of die thereon separated by a plurality of scratches cut into scribe lines on the die side;

forming a protective coating upon the die side, wherein the protective coating includes a flexible plastic sheet situated upon a double-sided adhesive tape that is upon a table;

grinding the back side to divide the semiconductor wafer into plurality of separated, unconnected die, each said die having said back side opposite said die side and having a thickness in a range between 0.762 millimeters to about 0.2 millimeters;

stretching said flexible plastic sheet so as to increase the separation between said first and second portions of said semiconductor substrate; and performing a chip packaging process upon each die of said plurality of die to package each die of said plurality of dies in a die package.

19. A chip packaging method comprising:

providing a semiconductor wafer having integrated circuitry including a plurality of dies formed within a die side opposite a back side thereof;

cutting recesses into the die side, each recess having an opening at said die side and a closed end proximal said back side;

forming a protective covering over said die side, wherein the protective coating includes a flexible plastic sheet situated upon a double-sided adhesive tape that is upon a table;

positioning the protective covering upon a surface with the back side of the semiconductor substrate exposed;

thinning the thickness of the semiconductor wafer by grinding the back side thereof until the closed end of each of the recesses is breached, whereby the semiconductor wafer is separated into a plurality of unconnected pieces each having said die side and said back side and one die of said plurality of dies therein;

stretching said flexible plastic sheet so as to increase the separation between said first and second portions of said semiconductor substrate; and forming a die package for each die of said plurality of dies.

20. A method as defined in claim 19, wherein said thinning is a process selected from a group consisting of:
a mechanical process and a chemical-mechanical process.

21. A method as defined in claim 19, wherein cutting recesses into the die side is a sawing operation using a saw blade that saws into but not through said semiconductor substrate.

22. A method as defined in claim 19, wherein cutting recesses into the die side
cuts into but not through the semiconductor wafer at scribe lines in the die side.

23. A method as defined in claim 19, wherein, during said thinning, said protective covering adheres said semiconductor substrate to said table with the back side of the semiconductor wafer exposed.

24. A chip packaging method comprising:

providing a silicon wafer;

fabricating a plurality of dies in a die side of said silicon wafer, said die side being opposite a back side of said silicon wafer;

forming a photoresist layer over said die side;

cutting into but not through said die side so as to define in said die side a plurality of pieces;

securing said semiconductor wafer to a grinding surface such that the back side thereof is exposed;

removing material from the back side of said semiconductor wafer by an abrading operation until each of said plurality of pieces is out of contact with other of said pieces, said material being removed by a process selected from a group consisting of mechanical planarization and chemical-mechanical planarization, wherein said silicon wafer is situated upon a flexible surface, each said piece having:
said back side opposite said die side; and
at least one die formed in the die side thereof;

stretching said flexible surface so as to increase the separation between said plurality of pieces;

performing a die packaging sequence comprising:
removing said photoresist layer from the die side of each said piece; and
packaging in a die package each said at least one die in the die side of each said piece of said plurality of pieces.

* * * * *

UNITED STATES PATENT AND TRADEMARK OFFICE
CERTIFICATE OF CORRECTION

PATENT NO. : 6,162,703
DATED : December 19, 2000
INVENTOR(S) : Tom A. Muntifering; Steven W. Heppler; Michael B. Ball It is certified that error appears in the above-identified patent and that said Letters Patent is hereby corrected as shown below:

Column 1,
Line 44, after "to separate the dies" delete [the]

Column 2,
Line 44, before "sawing and scribing" change "involves" to -- involve --
Line 58, after "sawing the wafer" change "to" to -- into --

Column 3,
Line 52, after "surface with" insert -- the --
Line 53, after "Saw or scribe" change "line" to -- lines --
Line 63, after "The saw or" change "scribes" to -- scribe --
Line 64, after "serve to" change "relief" to -- relieve --

Column 4,
Line 30, after "situated upon" change "a" to -- the --
Line 61, change "31" to -- 29 --

Column 5,
Line 12, after "surface 22 is depicted in" change "FIG. 3" to -- FIG. 4 --
Line 14, change "FIG. 1" to -- FIG. 4 --
Line 54, after "overcome" insert -- . -- (period)
Line 66, after "which serve to" change "relief" to -- relieve --

Column 8,
Line 37, after "stretching said flexible" change "surface" to -- plastic sheet --

Signed and Sealed this

Eighteenth Day of December, 2001

Attest:

*Attesting Officer*

JAMES E. ROGAN
*Director of the United States Patent and Trademark Office*